United States Patent
Hao et al.

(10) Patent No.: US 7,417,918 B1
(45) Date of Patent: Aug. 26, 2008

(54) METHOD AND APPARATUS FOR CONFIGURING THE OPERATING SPEED OF A PROGRAMMABLE LOGIC DEVICE THROUGH A SELF-TIMED REFERENCE CIRCUIT

(75) Inventors: Eunice Y. D. Hao, Saratoga, CA (US);
Tony K. Ngai, Saratoga, CA (US);
Jennifer Wong, Fremont, CA (US);
Alvin Y. Ching, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 454 days.

(21) Appl. No.: 10/954,927

(22) Filed: Sep. 29, 2004

(51) Int. Cl.
*G11C 8/18* (2006.01)
(52) U.S. Cl. ............... 365/233.12; 365/233.14; 365/196; 365/195; 365/194; 365/189.05; 326/38; 326/40; 326/46
(58) Field of Classification Search ............... 365/194, 365/233, 196, 195, 189.05, 233.12, 233.14, 365/233.1; 326/38, 45, 44, 40, 46
See application file for complete search history.

(56) References Cited

U.S. PATENT DOCUMENTS

| | | | | |
|---|---|---|---|---|
| 5,386,388 | A * | 1/1995 | Atwood et al. | 365/185.22 |
| 5,964,884 | A * | 10/1999 | Partovi et al. | 713/503 |
| 6,201,757 | B1 | 3/2001 | Ward et al. | 365/230.05 |
| 6,212,117 | B1 | 4/2001 | Shin et al. | 365/205 |
| 6,301,176 | B1 | 10/2001 | Brown | 365/203 |
| 6,438,057 | B1 * | 8/2002 | Ruckerbauer | 365/222 |
| 6,785,184 | B2 * | 8/2004 | Nguyen et al. | 365/227 |
| 7,132,851 | B2 * | 11/2006 | Young | 326/41 |
| 7,164,289 | B1 * | 1/2007 | Choe et al. | 326/40 |
| 7,187,200 | B2 * | 3/2007 | Young | 326/41 |

* cited by examiner

*Primary Examiner*—Andrew Q Tran
(74) *Attorney, Agent, or Firm*—Kin-Wah Tong

(57) ABSTRACT

Method and apparatus for configuring a programmable logic device to operate at a plurality of clock frequencies comprising configurable programmable self-timed delay circuits and associated configuration software. The configurable IC clock frequencies increase device performance and manufacturing yield.

13 Claims, 4 Drawing Sheets

METHOD AND APPARATUS FOR CONFIGURING THE OPERATING SPEED OF A PROGRAMMABLE LOGIC DEVICE THROUGH A SELF-TIMED REFERENCE CIRCUIT

FIELD OF THE INVENTION

The present invention is directed generally to integrated circuits, such as programmable logic devices, containing embedded RAM blocks or other speed sensitive architectures. More particularly, the invention relates to controlling self-timed reference circuits within those embedded architectures to enhance integrated circuit performance and yield.

BACKGROUND OF THE INVENTION AND PRIOR ART

Many programmable logic devices (PLDs) incorporate embedded speed sensitive architectures, e.g., blocks of random access memory (RAM) used as a specialized dedicated resource freeing programmable function generators to carry out other tasks. As with other semiconductor devices, these RAM blocks typically include a plurality of memory cells arranged by rows and columns to form a relatively dense array. Each row of memory cells connects to a word line that, when activated by the decoding of an address, accesses the bit cells of that row. Word line activation causes the data of each cell of the row to be passed to a pair of bit lines of the column in which the cell is located. A sense amplifier is then enabled at the appropriate time after the bit line voltages have stabilized to sample the voltage difference on the bit lines, and convey the sampled data to an output register or some other output. Sampling the bit lines too early, i.e., before the differential true/complement voltages are fully developed can result in an incorrect reading of the bit lines. Sampling the bit lines later than really needed can slow down RAM operation thereby reducing the performance of the block RAM and the overall device in which the RAM is embedded.

Although there are a number of technologies available, PLDs typically employ complementary metal oxide semiconductor technology (CMOS) to implement static RAM blocks in a PLD. Efforts to increase density and speed in the CMOS block RAMS have made the circuitry more vulnerable to manufacturing variations, power fluctuations, and operating environmental changes. For example, variations in the process used to produce the memory circuit, can cause the circuitry formed on one part of the device to have different operating characteristics from circuitry on another part of that same device. This creates problems when generating control signals that sequence and/or control the operation of a RAM block, such as the enable signals used to control the sense amplifiers discussed above. These process variations can cause the sense amplifiers in one RAM block to be enabled and sample the bit lines at the wrong time, causing faults in the memory read process and the production of bad data.

A common solution to adjust for such process variations is to incorporate a self timing circuit into the RAM block that generates control signals, such as the enable signal for the sense amplifier, thereby controlling the access to the RAM to occur at the right time. By placing the self timing circuit in the same geographic location on the device and using the same types of device structures as the block RAM itself is made from, the designer can be confident the self timing circuit will create the enable signal at the appropriate time. One typical self timing circuit design uses an inverter chain made from inverters tuned to have the same delay as the cross coupled inverters that make up the block RAM cells to generate the control signals. These self timing circuits can ameliorate problems created by process variations or variations resulting from operating conditions (e.g., temperature and/or power fluctuations). This and other typical prior art self-timed reference circuit solutions are disclosed in U.S. Pat. No. 6,212,117, U.S. Pat. No. 6,201,751, and U.S. Pat. No. 6,301,176 which are hereby incorporated by reference in their entireties.

One of the problems with these approaches is the self-timed delay path is not adjustable after the device is manufactured. Because the self-time delay circuit is not adjustable after manufacture, a large design margin must be incorporated into the design to increase manufacturing yield of devices that meet the design requirements. However, incorporating large design margins into the self-timed circuit design inhibits the speed and maximum performance that can be expected from the memory. This reduced memory performance in the block RAMS also reduces the overall performance of the PLD. The large design margin also makes it difficult or impossible to migrate the block RAM memory design to a different manufacturing process, different voltage supply level, or different speed-grade when trying to balance those desired features and obtain optimum yields in the manufacturing process.

Moreover, as the development of the silicon manufacturing process technology continues, feature sizes are shrinking rapidly. As a result of shrinking feature sizes, process variation becomes more pronounced, decreasing manufacturing yields. Likewise, parasitic capacitances become more significant, also reducing manufacturing yield. Moreover, it is increasingly difficult to track the reference path delay with the data path delay precisely across different manufacturing lots. To address these issues design margins can be increased, further sacrificing memory performance for design yield. Alternatively, design margins can be left unchanged in order to enhance performance, causing functional instability and yield loss.

Accordingly, an approach that eliminates these disadvantages is needed.

SUMMARY OF THE INVENTION

Broadly, the present invention provides methods and apparatus to provide in-field configurability to self-timed reference delay circuits in embedded speed sensitive asynchronous architectures of programmable logic devices, thereby allowing in-field adjustability to internal delay margins. This programmable delay capability in turn allows post manufacture programmable selection of the speed grade of a programmable logic device. The invention creates the ability to achieve high performance PLDs for "fast silicon" and high yields for PLDs made from "slower silicon." Furthermore, by providing configurable internal delay margins after full silicon characterization, it is also possible to migrate the same memory or other speed sensitive architectural designs to different manufacturing processes and different operating conditions.

DETAILED DESCRIPTION OF THE PREFERRED EMBODIMENT

Figure 1:
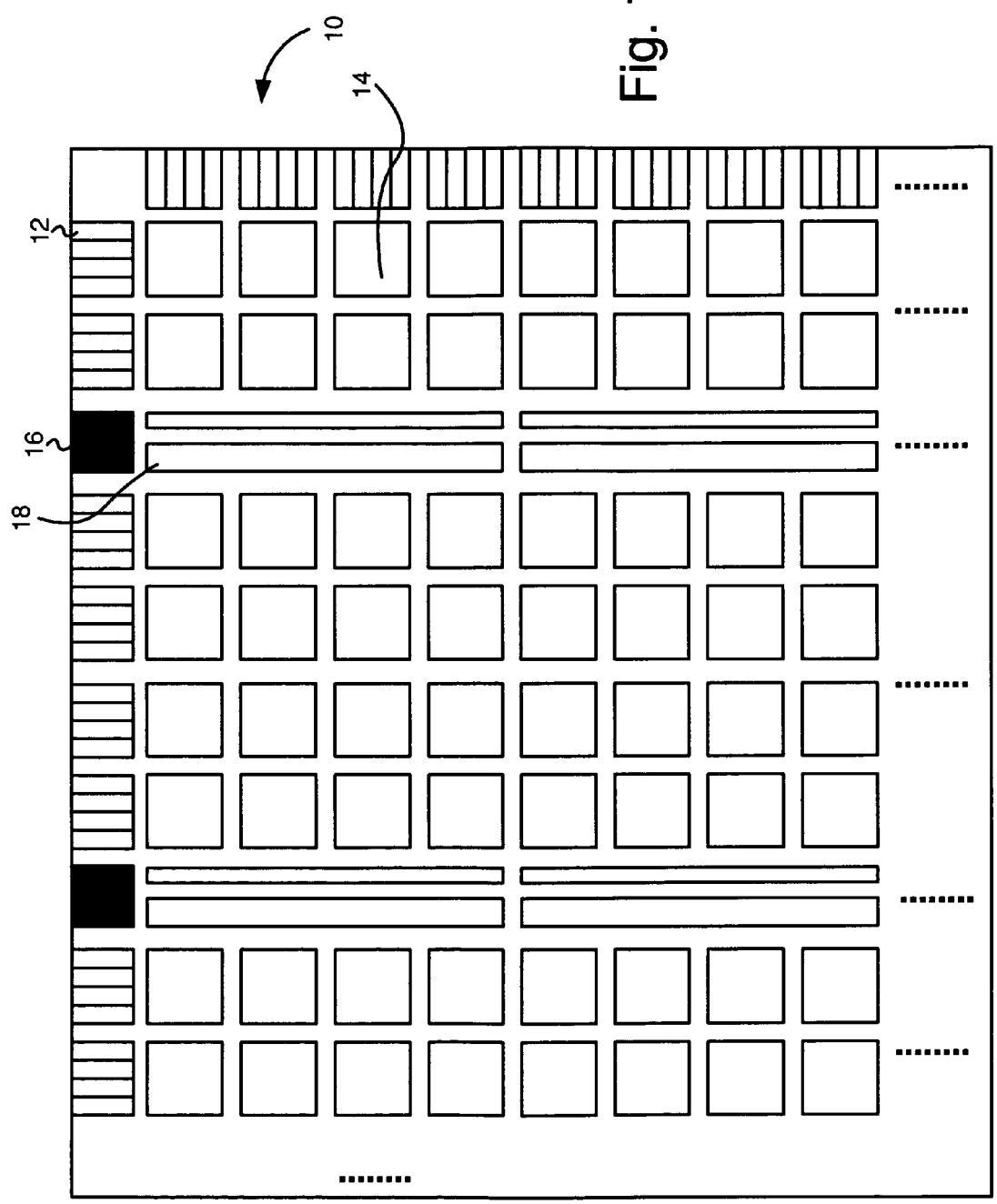
FIG. 1 is a schematic block diagram view of the logical layout of a portion of a PLD that may be used in accordance with the invention.

Programmable logic devices exist as a well-known type of integrated circuit (IC) that may be programmed by a user to perform specified logic functions. There are different types of programmable logic devices, such as programmable logic arrays (PLAs), complex programmable logic devices (CPLDs), and Field Programmable Gate Arrays (FPGAs) among others. Many PLDs have the types of embedded speed sensitive architectures that employ self-timed reference delay circuits used in the present invention.

After a PLD with an embedded asynchronous speed sensitive architecture has been manufactured, that PLD must be tested for operability. Part of that testing includes speed binning, the practice of identifying the fastest speed or clock frequency at which the device may be run. Typically, this testing will proceed by cycling through different clock speeds, slowest to fastest, to establish the fastest clock frequency at which the device will operate. The speed binning will result in a plurality of different speeds at which the manufacturer will guarantee the different ICs will operate. Each device will be broadly categorized into one of the speed bins. Such binning means the device operates in a range of clock speeds around a benchmark number, e.g., 500 Mhz±15%.

One variety of PLD is a FPGA. FPGAs are known for a superior combination of capacity, flexibility, and low cost. A typical FPGA comprises an array of configurable logic blocks (CLBs) surrounded by input-output blocks (IOBs) and are interconnectable through a routing structure. The routing structure comprises many interconnect pathways and associated programmable interconnection points. In typical FPGAs, the programmable interconnection point is controlled by a pass transistor that is turned on and off depending on the configuration data stored in an associated memory cell.

The CLBs and routing structure of the FPGA are arranged in an array wherein respective CLBs and associated portions of the routing structure are placed edge to edge in what is commonly referred to as a "tiled" arrangement. The CLB portion of a "tile" comprises a plurality of primitive cells which may be interconnected in a variety of ways to perform a desired logic function. For example, a CLB may comprise a plurality of look-up tables, multiplexers, and registers. The periphery of the device typically comprises a plurality of IOBs for interfacing between the device and the outside world. These blocks are programmable also by storing configuration data in memory cells that control the functionality of the IOBs. The CLBs, IOBs, and interconnect structure are typically programmed by loading configuration data (bitstream) into internal configuration memory cells that define how the CLBS, IOBS, and interconnect structure are configured. The configuration bitstream may be read from an external memory (e.g., an external PROM). The states of the individual memory cells then determine the functionality of the FPGA.

Later generation FPGAs include additional specialized circuitry intended to perform certain functions common to many designs that are therefore typically helpful to large numbers of FPGA users who may employ the specialized circuitry and free up the resources of the configurable logic found in the CLB blocks to perform other application specific functions. The special function blocks can include speed sensitive architectures such as block random access memories (BRAM) that can be employed as highly versatile RAMs thereby freeing up memory cells of look-up tables found in CLBs to perform combinatorial logic functions. Although the invention is described with reference to a SRAM based FPGA, it may be implemented using other programmable logic architectures such as macrocell based CPLDs and other configuration memory technologies such as non-volatile memory cells (e.g., EPROMS, anti-fuses, and FLASH ROMS).

FIG. 1 shows a portion of a FPGA 10 and some of the major functional blocks that make up the FPGA. These include IOBs 12 at the periphery of the device for programmably performing input, output, and tri-state functions, as well as others, associated with communications on and off chip. Also included is an array of CLBs 14, one or more digital clock manager (DCM) blocks 16 capable of performing complex clock related functions such as correcting clock skew, frequency synthesis, and phase shifting. Also included are block RAMs 18. In preferred embodiments the block RAM is capable of being configured to operate as either single port or dual port RAM having a number of configurable aspect ratios. Other FPGA architectures are possible, having alternative arrangements and other resources. An example of an alternate FPGA arrangement is described in co-pending U.S. patent application Ser. No. 10/683,944 by Young, entitled "Columnar Architecture" and filed on Oct. 10, 2003, which is incorporated herein in its entirety.

While the invention will be further described using the particular example of the block RAM architecture, it is of course applicable to any speed sensitive architecture employing self-timed reference delay circuitry where precise tracking and late stage adjustment of the delay are beneficial as will be appreciated by one of ordinary skill in the art. Such other circuitry may include clock path tracking circuitry in a DCM block, and clock path tracking in source synchronous IOBs as well as others.

Figure 2:
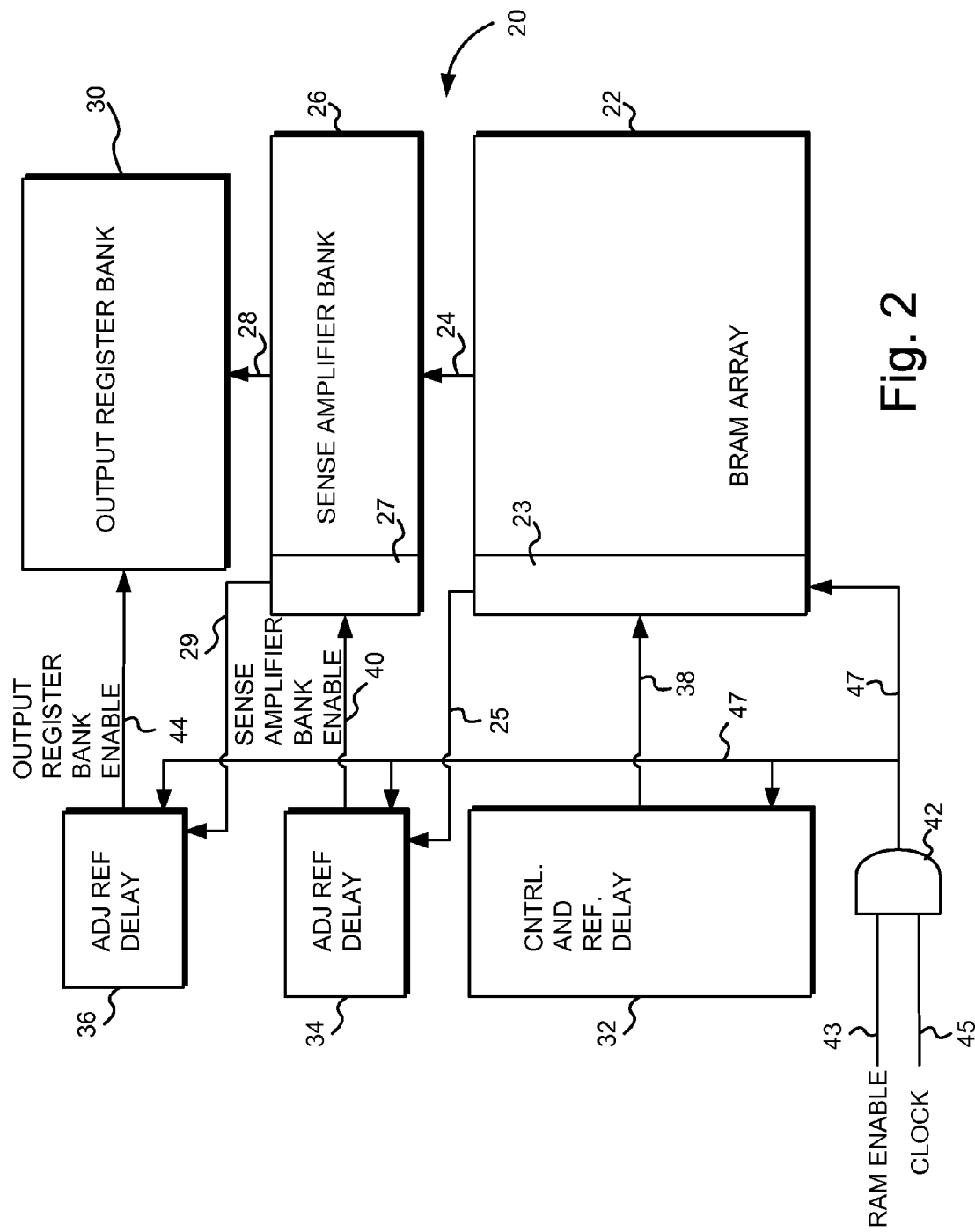
FIG. 2 is a schematic block diagram of the functional blocks of a block RAM used in one embodiment of the invention.

Turning then to FIG. 2, a BRAM 20 is shown in schematic block diagram form. The BRAM includes a BRAM array 22. As will be appreciated by one of ordinary skill, the BRAM array includes a plurality of memory cells or bits (not shown) arranged in rows and columns with each row representing a word in memory and each column containing one bit of the word. Each column of bits is connected through output lines 24 to sense amplifiers found in the sense amplifier bank 26. BRAM array 22 also includes a reference column 23 that comprises memory cells tied high and that develops self-timed reference signal 25 as is well known in the art.

Sense amplifier bank 26 comprises a plurality of sense amplifiers each connected to an individual column of bits from BRAM array 22 as is conventional. Each sense amplifier has an output 28 connecting to output register bank 30. Sense amplifier bank 26 also includes reference sense amplifier 27, which generates self-timed reference signal 29. The outputs from the sense amplifiers are each connected to a register in the output register bank 30. Although connections 24, 28 are shown as a single line in the figure, they each represent multiple connections as described above. BRAM 20 also comprises control and reference delay block 32, adjustable reference delay block 34, and adjustable reference delay block 36. BRAM 20 further includes two input AND gate 42 that receives as its inputs RAM enable signal 43 and clock signal 45 and produces as its output enable signal 47. RAM enable signal 43 and clock signal 45 may be generated elsewhere on the device.

Each of a plurality of word lines 38 connects to one row of memory cells in array 22. Address signals for reading or writing the BRAM 20 may be sent from elsewhere on the IC to control block 32, which decodes the address and selects the address from BRAM array 22 by generating the appropriate signals on word lines 38. This circuitry is conventional in the art. In a typical array, the word lines 38 connect to pass transistors of each bit cell in a row, and each bit cell connects to a pair of bit lines. The pass transistors of a particular row will be activated to access the memory cells of that row for a read by the sense amplifiers of bank 26.

Briefly, operation of the BRAM 20 is as follows. An address is applied to address logic and latched within control block 32. RAM enable signal 43 goes high and when clock signal 45 goes high enable signal 47 will go high enabling BRAM array 22. The word line 38, corresponding to the applied address, is activated to turn on the pass transistors of each bit cell in the row corresponding to the selected word line. The now "on" pass transistors pass the state held by the bit cell to the associated sense amplifier in bank 26. At the appropriate time, the sense amplifier of each column is turned on with an enable signal 40 developed by adjustable reference delay block 34 as will be described below.

Proper operation of the sense amplifiers, i.e., when to turn them on for latching data, is imperative for high speed, low power operation. Turning the sense amplifiers on too soon, before the memory cell data from the selected row has stabilized on the sense amplifier inputs, can result in an erroneous data readout. On the other hand, waiting too long before turning on the sense amplifiers unnecessarily slows the data read operation decreasing the speed of BRAM 20 and ultimately decreases the speed of the entire device to the extent the device relies on data stored in the BRAM to perform its functions.

To address this issue a self-timed reference delay circuit may be employed that generates the enable signal 40 for the sense amplifier bank 26. Various self-timed reference signal schemes have been proposed, as described above. In this embodiment, a duplicate column of memory cells 23 is used to generate the self-timed signal. The duplicate column 23 propagates the signal through the column in the same time as data propagates from the other columns in the array 22 thereby enabling the sense amplifiers 26 at the same time that the data from the array is available to the sense amplifiers. The enable signal may be programmably delayed in block 34 as will be described below.

A second self-timed reference delay signal may also be provided, in this case shown as register enable signal 44. Register enable signal 44 enables the latching of data into the individual registers found within output register bank 30. Each sense amplifier output 28 is connected to the input of an output register in output register bank 30. Once the sense amplifiers of sense amplifier bank 26 have read and produced the value of memory cell from the selected word row to which it is connected, the data is ready to be latched into the output register bank 30. As with the sense amplifier bank, it is critical to perform this latching operation only after the sense amplifiers have developed their signals. Once again, attempting a latch operation too soon will lead to storing incorrect data, while waiting too long will slow down the speed of the entire memory. Thus, a self-timed reference delay signal called register enable 44 may be provided to ensure a proper latching cycle. A reference sense amplifier 27 is provided to generate a self-timed reference delay signal 29 that may be selected in block 36 to become enable signal 44, or a delayed version may also be provided as signal 44 as will be described below with respect to FIG. 3. The registers of output register bank 30 are of a standard design well known to one of ordinary skill in the art.

Care must be taken not to cut the timing of the self-timed reference delays too fine in order to enhance device speed because process and other variations can affect timing and the turning "on" of the sense amplifiers in bank 26, and can cause mistimed latching of the registers in bank 30. Thus, the timing that works for one memory, or a portion of a memory, may not work for another memory or portion of a memory on the same chip. It is for this reason that worst case design paradigms are used to ensure that the timing signals will be appropriate for all conditions, variations, and fluctuations. This, however, works against achieving high speed and low power operation.

In order to maximize both device yield and device speed, the adjustable reference delay blocks 34, 36 are provided to enable post manufacture tuning of timing, thereby enhancing both device speed and manufacturing yields by allowing the self-timed reference delay signals to be adjusted longer or shorter as appropriate given the speed characteristics of the different devices as actually manufactured.

Figure 3:
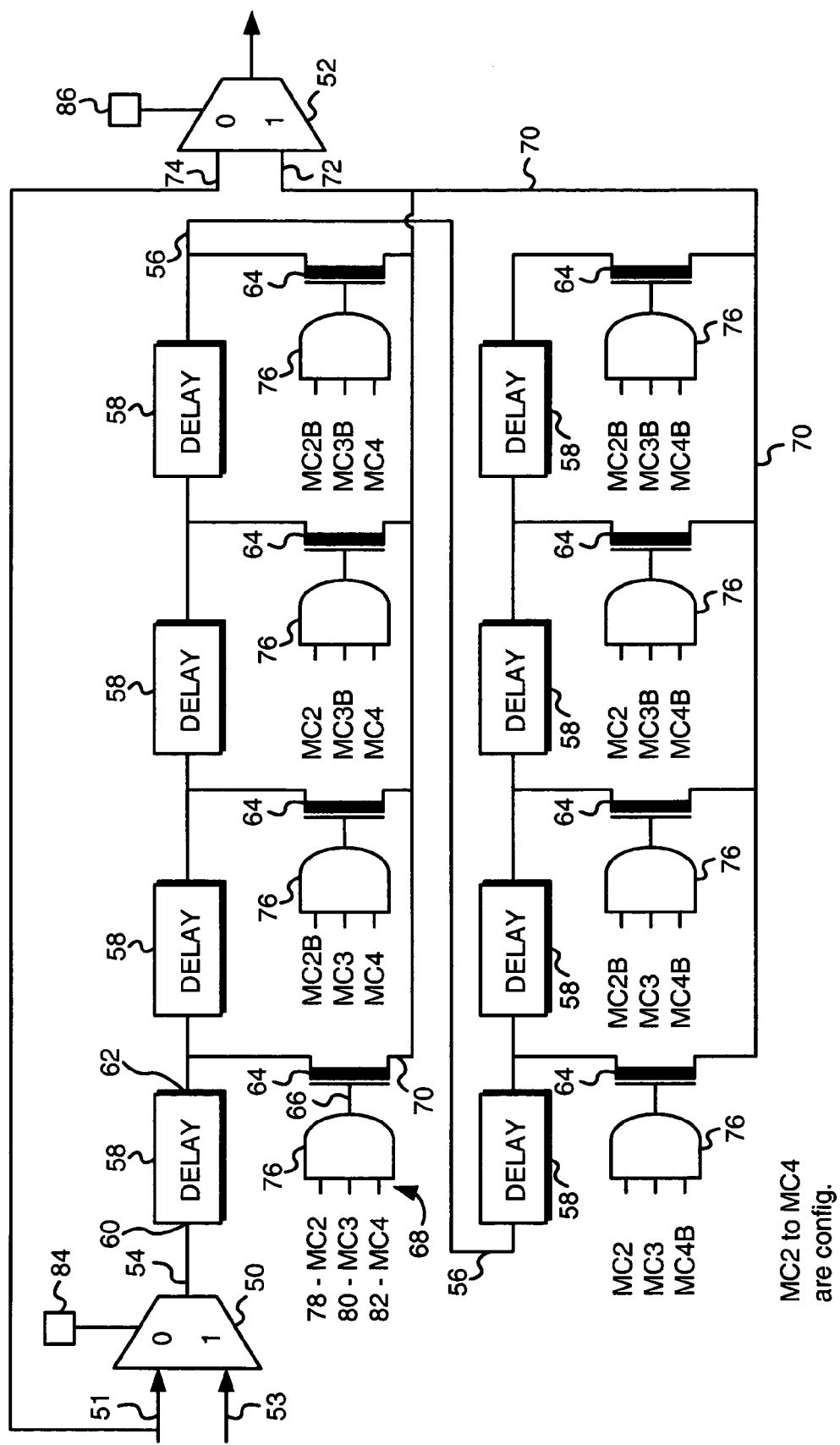
FIG. 3 is a schematic diagram of configurable delay path circuitry used in one embodiment of the present invention.

FIG. 3 shows in schematic form the detail of the adjustable reference delay blocks 34, 36. In this embodiment there is a block input mux 50 and a block output mux 52. Input signal selection for the block input mux 50 and block output mux 52 are each controlled by a separate configuration memory cell 84, 86 respectively. As will become apparent, depending on the programming of memory cells 84, 86 the output signal from the reference and delay control block can be a delayed or non-delayed version of self-timed reference signal 25, 29 (FIG. 2), or a delayed version of enable signal 47 (FIG. 2).

The block input mux 50 has two inputs 51, 53. The first input 51 is connected to self-timed reference delay signal 25 generated in the reference column 23 shown in FIG. 2. Alternatively, for adjustable reference delay block 36 input signal 51 is connected to self-timed reference delay signal 29 generated by reference sense amplifier 27. For both adjustable reference delay blocks 34, 36 the second input 53 is connected to enable signal 47 generated by AND gate 42 (FIG. 2). The output 54 of the block input mux connects to a programmable delay path 56 comprising multiple delay blocks 58 connected in series. Each delay block 58 is made of a unit time delay buffer (not shown). Each delay block is designed to have a well-controlled equal delay with each other delay block 58. There is an input side 60 and an output side 62 on each delay block 58. Connected to the output side 62 of each delay block is the source of a pass transistor 64 which has a control gate 66 connected to decode logic 68 and its drain lead connected to a common node 70. The common node 70 is connected as one of the inputs 72 to the block output mux 52. The other input 74 to the block output mux comes from the self-timed delay signal 25 and 29 for adjustable reference delay blocks 34 and 36 respectively.

The decode logic 68 that controls the gate 66 of the pass transistor 64 comprises an AND gate 76 with three inputs each connected to a different configuration memory cell (78, 80, 82). The AND gate output is connected to the control gate 66 of the pass transistor. The configuration memory cells (78, 80, 82) will have a true and complement output each connected to a different logic gate 76. In the notation of FIG. 3 a "B" after a memory cell signal name denotes the complement output of the memory cell. MC2 and MC2B are the true and complement outputs of memory cell MC2 (78). Thus, in the embodiment of FIG. 3 because only one of the pass transistors 64 should be active for any given programming, and there are eight pass transistors allowing for eight different potential delays, only three configuration memory cells are required to configure the delay path. Although eight programmable delays are depicted in FIG. 3, fewer or greater delays may be incorporated as a matter of design choice as will be appreciated by one of ordinary skill in the art. Other control logic schemes may also be employed to configure the delay path.

For example, if each of the configuration memory cells (78, 80, 82) is loaded with a logic high value, then the selected path between the block input mux 50 and block output mux 52 will only travel through the first delay block 58. The signal will travel from the input mux output 54 through the first delay block 58 through the first pass transistor 64 to common node 70 and to input 72 of the block output mux 52. Because each of the remaining AND gates 76 in the structure receives at least one of the complement outputs from the configuration memory cells, each will have at least one low input causing the associated AND gate output to be low which leaves the associated pass transistor 64 in the off state. Assuming that the block output mux is programmed by its associated configuration memory cell 86 to select the input 72 from the delay path circuitry as its output, then whichever signal is selected at the block input mux 50 will pass through one delay before proceeding out of the delay control block. If no delay is required then the configuration memory cell 86 for the block output mux 52 will be set to select the self-timed reference signal that does not pass through the delay path circuitry on input 74.

By thus configuring the memory cells of adjustable reference delay blocks 34, 36 up to nine different delay periods for operation of BRAM 20 are possible. These range from no delay up to eight delay blocks being traversed by the selected block input signal before the associated sense amplifier enable signal 40 or register enable signal 44 is presented to the circuitry that each controls. Furthermore, these blocks select which signal will become the enable signal of the associated circuitry, either the enable signal 47 or the self-timed reference signals 25, 29. In the present embodiment it is anticipated only three speed grades will be employed.

In an alternative embodiment, the configuration memory cells of FIG. 3 may be implemented using non-volatile memory cells such as PROMS, fuses, anti-fuses, or any other appropriate one time programmable memory cell. In this embodiment, the speed grade of the device would be determined by programming in the factory before the product is shipped to customers. In general, programming of configuration memory cells relating to speed grade in this embodiment would not be accessible to an end user but rather would be determined by the manufacturer and be unalterable after programming had occurred.

After a FPGA of the present invention is manufactured, then it must be speed characterized or binned. First, the RAM block will be tested to ensure basic functionality. The basic functionality test will be carried out by imposing the maximum delay into the system configuring the appropriate delay configuration memory cells such that the longest delay path will be selected for each delay control block 34, 36. The device is then repeatedly tested and the BRAMs are successively configured using shorter and shorter delays until the device either fails, in which case it is speed graded at the last level at which it passed, or until all delays have been removed from the delay path. In the latter instance the device is binned as the highest speed device. In a presently preferred embodiment, the devices are tested to operate at only three separate speed settings. However, any number of speed gradings are possible depending on the reliability of the speed characterization and the desirability of having many speeds.

Once a device has been speed graded it will be sold to the marketplace at the fastest speed under which it reliably performed the testing. The particular testing and quality requirements for passing those tests are well understood to those of ordinary skill in the art.

One advantage of one embodiment of the present invention is that the end user can use software to configure the purchased device to the appropriate speed grade with little intervention in the design process. In preferred embodiments, user incorporation of a particular speed graded device into the design will require no further intervention other than indicating to the design software the device constraints including the speed of the device.

Figure 4:
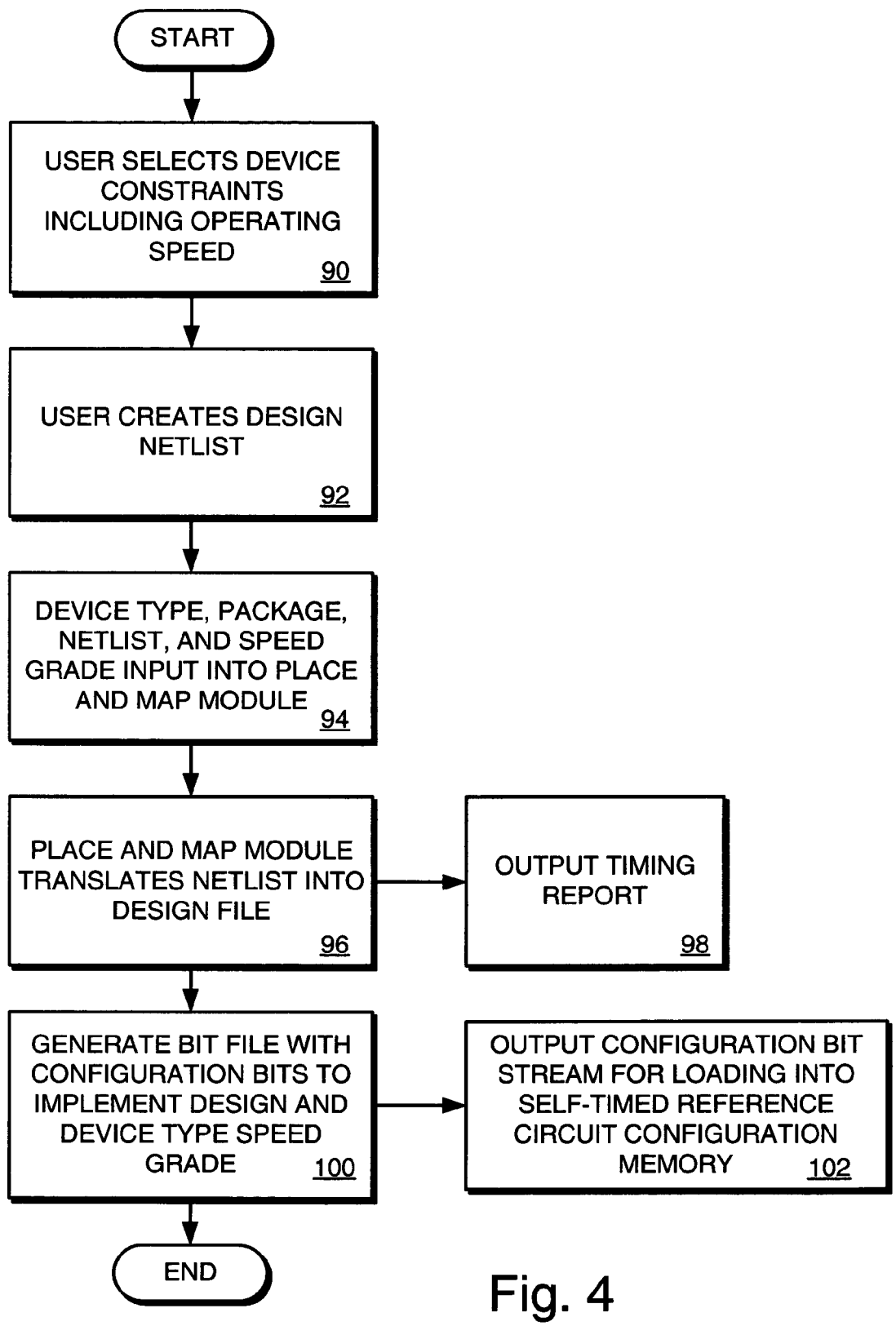
FIG. 4 is a flow diagram showing the steps a computer program of one embodiment of the present invention may follow.

FIG. 4 shows a typical design cycle for creating the configuration data file that will be used to program a FPGA to perform the user's desired function at the selected speed grade. At step 90 the user indicates to the design software the device constraints for the FPGA to be incorporated into the user's design. These include the size of the target FPGA (i.e., logic gates on-board), the profile (e.g., package type), and the clock speed for the device. These are all predetermined depending on the FPGA purchased by the user. At step 92, the user creates the logic design to be implemented by the FPGA. This can be done interactively using tools provided by the software or by separate design software packages that create appropriate output for use with the configuration software. This process is well understood in the art. The result of this step is a netlist of the user's logic design. The netlist is input into the place and map module of the software at step 94. In addition to the netlist, the device type, package, and speed are also input into the place and map module of the software. At step 96 the place and map module will locate and assign the various logic functions of the user's design to the different chip resources for the target device (e.g., CLBs, IOBs, BRAMS, and interconnect). The module translates this information into a design file that can simulate how the target FPGA would operate and will produce among other outputs a timing report 98 showing anticipated device operation. The design file will indicate the device speed grade used in the design. At step 100 the configuration software will generate a configuration bit file that will program the target FPGA with the particular placed, mapped, and routed design created in step 96. At this time the software will also create the bitstream for the speed grade of the device. In particular, the bits for configuring the programmable delay memory cells of the delay control blocks 34, 36 will be generated in the appropriate place in the configuration bit file. Thus, the output 102 of this step will be the speed selected configuration bitstream that implements the user's netlist on the particular target FPGA device at the appropriate speed for the target FPGA.

While the configurable delay control block and configuration of that block have been described with respect to a self-timed reference circuit for use with the BRAM in a FPGA, the same concepts may be employed to the reference delay of a latch-enable signal or any other self-timed reference circuits where precise tracking and post manufacture adjustment of the delay are useful or required in many different types of ICs.

We claim:

1. A method of configuring an integrated circuit device comprising:
   selecting an operating speed from a plurality of speed grades for the integrated circuit device;
   generating configuration data to operate the integrated circuit device at the selected speed; and
   loading at least one memory cell with the configuration data, the at least one memory cell controlling a self-timed reference circuit within the integrated circuit device.

2. The method of claim 1 wherein the at least one memory cell controls signal delay for the self-timed reference circuit.

3. The method of claim 1 wherein the self-timed reference circuit generates a control signal for reading a RAM.

4. The method of claim 1 wherein the self-timed reference circuit generates a control signal for operating a latch.

5. The method of claim 1 wherein the self-timed reference circuit generates an enable signal for a sense amplifier.

6. The method of claim 1 wherein the self-timed reference circuit generates an enable signal for a RAM output register.

7. The method of claim 1 wherein the operating speed is selected from a plurality of predetermined speed grades related to the clock frequency at which the integrated circuit device will be operated.

8. A method of configuring a programmable logic device comprising:

selecting an operating speed of the programmable logic device;

generating configuration data to operate the programmable logic device at the selected speed; and loading at least one memory cell with the configuration data, the at least one memory cell controlling a self-timed reference circuit within the programmable logic device.

9. The method of claim 8 wherein the at least one memory cell controls signal delay for the self-timed reference circuit.

10. The method of claim 8 wherein the self-timed reference circuit generates a control signal for reading a RAM.

11. The method of claim 8 wherein the self-timed reference circuit generates a control signal for operating a latch.

12. The method of claim 8 wherein the self-timed reference circuit generates an enable signal for a sense amplifier.

13. The method of claim 8 wherein the self-timed reference circuit generates an enable signal for a RAM output register.

* * * * *